United States Patent
Ghosh et al.

(10) Patent No.: US 6,218,855 B1
(45) Date of Patent: Apr. 17, 2001

(54) DATAPATH GLOBAL ROUTING USING FLEXIBLE PINS FOR SIDE EXITING BUSES

(75) Inventors: Pradiptya Ghosh; Robert J. Walsh, both of Mountain View, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/384,949

(22) Filed: Aug. 27, 1999

(51) Int. Cl.[7] .................................................. H03K 19/173
(52) U.S. Cl. ............................................. 326/38; 326/101
(58) Field of Search ........................... 326/38, 41, 93–98, 326/101–103; 716/9, 10, 11, 18

(56) References Cited

U.S. PATENT DOCUMENTS

| | | | |
|---|---|---|---|
| 4,926,066 | * 5/1990 | Maini et al. | 326/93 |
| 5,296,748 | * 3/1994 | Wicklund et al. | 326/93 |
| 5,471,157 | * 11/1995 | McClure | 326/93 |
| 5,471,409 | 11/1995 | Tani | 364/578 |
| 5,629,859 | 5/1997 | Agarwala et al. | 364/489 |
| 5,825,661 | 10/1998 | Drumm | 364/491 |
| 5,861,764 | * 1/1999 | Singer et al. | 326/93 |
| 5,867,396 | 2/1999 | Parlour | 364/489 |
| 5,903,577 | 5/1999 | Teene | 371/22.1 |

* cited by examiner

Primary Examiner—Michael Tokar
Assistant Examiner—Don Phu Le
(74) Attorney, Agent, or Firm—Sierra Patent Group, LTD (57) ABSTRACT

A method for routing a conductive path in an integrated circuit is described. The method includes providing a side exiting bus comprising at least one pin, and providing a plurality of functional units, at least one functional unit having a pin required to be electrically connected to a pin in the side-exiting bus. The method further includes routing a first conductive path from one of the at least one pins in the side exiting bus to a point external to the functional units, the resulting conductive path spanning the width of the plurality of functional units, and routing a second conductive path in a straight line from the at least one pin in the at least one functional unit to a point on the first conductive path.

3 Claims, 7 Drawing Sheets

DATAPATH GLOBAL ROUTING USING FLEXIBLE PINS FOR SIDE EXITING BUSES

BACKGROUND OF THE INVENTION

1. Field of the Invention

The present invention relates to routing connections between functional units and a side-exiting bus. More particularly, the present invention provides a method for efficiently routing conductive paths between functional units and side-exiting buses.

2. The Background Art

Integrated circuits have within them functional circuitry which operates on signal information in order to produce a desired result. Signals are typically multiple bits wide, and it is typical to provide groups of functional circuits which process that information.

Figure 1:
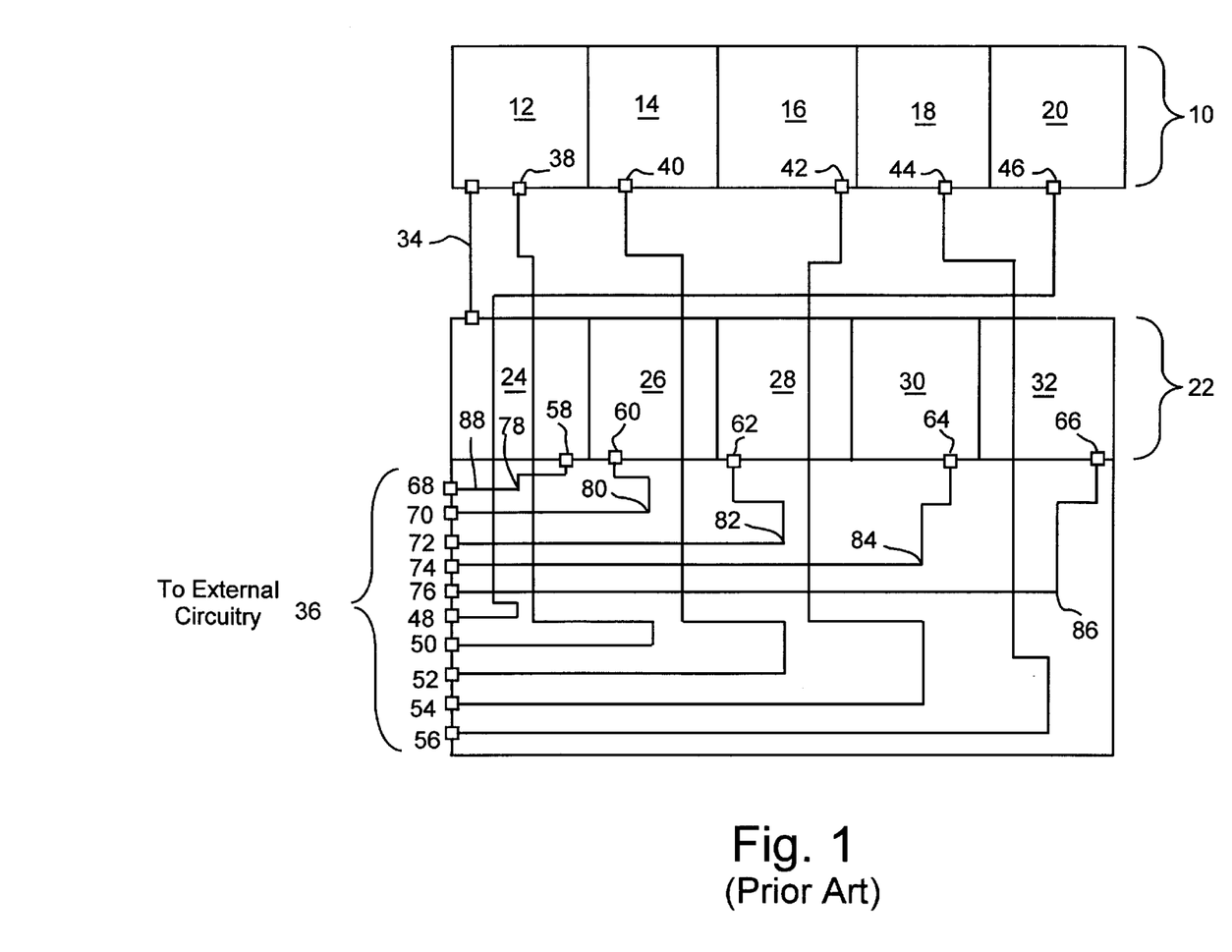
FIG. 1 shows the arrangement of functional units in an example prior art integrated circuit.

FIG. 1 shows the arrangement of functional units in an example prior art integrated circuit.

Referring to FIG. 1, group 10 includes functional units 12, 14, 16, 18, and 20, each having circuitry for processing bits of information in a signal. Group 22 also includes functional units 24, 26, 28, 30, and 32, each having circuitry for processing bits of information in a signal. Often there are several functional groups connected together in succession such as depicted herein where block 12 is connected to block 24 through conductive path 34. However, the present invention is directed to situations in which functional units interface with external circuitry such as through a side-exiting bus such as bus 36.

In the prior art routing example which follows, conductive paths are routed between various functional units and pins in bus 36. For example, functional units 12 through 20 inclusive have pins 38 through 46 inclusive which are required to be connected to pins 48 through 56 inclusive of bus 36. Note, however, that pin 46 is required to be connected to pin 48 in a "rotate right" configuration. Correspondingly, functional units 24 through 32 inclusive have pins 58 through 66 inclusive which are required to be connected to pins 68 through 76 inclusive of bus 36.

Prior to routing, functional unit 24, for example, includes pin 58 which is not yet connected to pin 68 of bus 36. In the prior art, when a side exiting bus is routed to a location containing functional units, conductive paths are routed from the side pins to locations which are approximately centered in the width of each functional unit. Thus, if a side-exiting bus were left-justified with respect to the set of functional units to which it will eventually connect (as shown in FIG. 1), the topmost pin on the bus is routed to a position such as position 78 in FIG. 1. The second and succeeding pins in the bus are routed to intermediate positions such as positions 80, 82, 84, and 86. The pins from the various functional units are then routed to the proper ones of positions 78, 80, 82, etc. which connect to the desired pin in the side-exiting bus 36.

While useful for its intended purpose of providing connectivity between functional units and side-exiting bus pins, the prior art method fails to minimize the complexity of the routing between intermediate positions and each functional unit. For example, the conductive path 88 between pin 58 and position 68 requires that two vertical lines and one horizontal line be routed. It would be beneficial to provide a routing method which minimizes the complexity of the conductive paths and in turn minimizes the horizontal and vertical resources used by a given conductive path.

A second example of an inefficient routing is provided in FIG. 1 where functional unit 20 has a pin 46 which is required to be connected to pin 48 of bus 36. This inefficient example is comparable of a "rotate right" operation, where the rightmost bit in a series of bits is removed from that position and added to the leftmost position in the series. Thus, a signal value of 01101 would become 10110 after the "rotate right" command. The prior art methods, when routing the connection between pin 46 and pin 48, consume many more vertical and horizontal resources than desired, while unnecessarily complicating the routing. Three vertical resources are used, and two horizontal resources are used to complete the routing.

Figure 2:
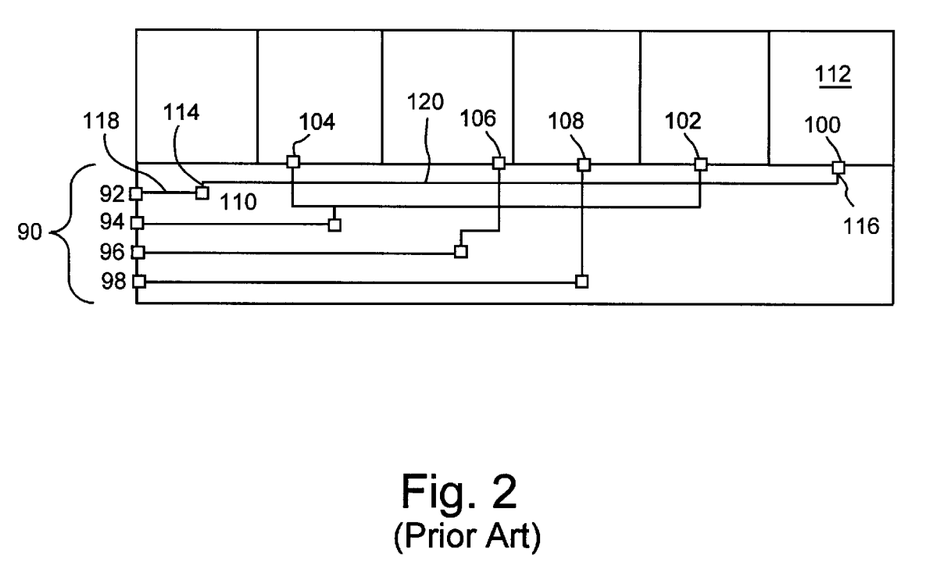
FIG. 2 shows the arrangement of functional units in a second example prior art integrated circuit.

A third example of an inefficient routing performed by prior art methods is provided in FIG. 2 where side-exiting bus 90 has pins 92, 94, 96, and 98 which are required to be connected to 100, 102, 104, 106, and 108 respectively. Using the prior art method, a connection to pin 92 will be routed to position 110. A conductor from position 110 would then be routed to pin 100 of functional unit 112. Routing the connectivity between pins 92 and 100 in this manner causes the vertical segment connecting the two pins to unnecessarily be broken into two pieces 114 and 116. Further, horizontal segment 118 is routed using a different horizontal pathway than used by segment 120.

It would be beneficial to provide a method for routing conductive paths which has increased efficiency over prior art methods.

SUMMARY OF THE INVENTION

A method for routing a conductive path in an integrated circuit is described. The method includes providing a side exiting bus comprising at least one pin, and providing a plurality of functional units, at least one functional unit having a pin required to be electrically connected to a pin in the side-exiting bus. The method further includes routing a first conductive path from one of the at least one pins in the side exiting bus to a point external to the functional units, the resulting conductive path spanning the width of the plurality of functional units, and routing a second conductive path in a straight line from the at least one pin in the at least one functional unit to a point on the first conductive path.

DETAILED DESCRIPTION OF ONE EMBODIMENT

Those of ordinary skill in the art will realize that the following description of the present invention is illustrative only and not in any way limiting. Other embodiments of the invention will readily suggest themselves to such skilled persons having the benefit of this disclosure.

Figure 3:
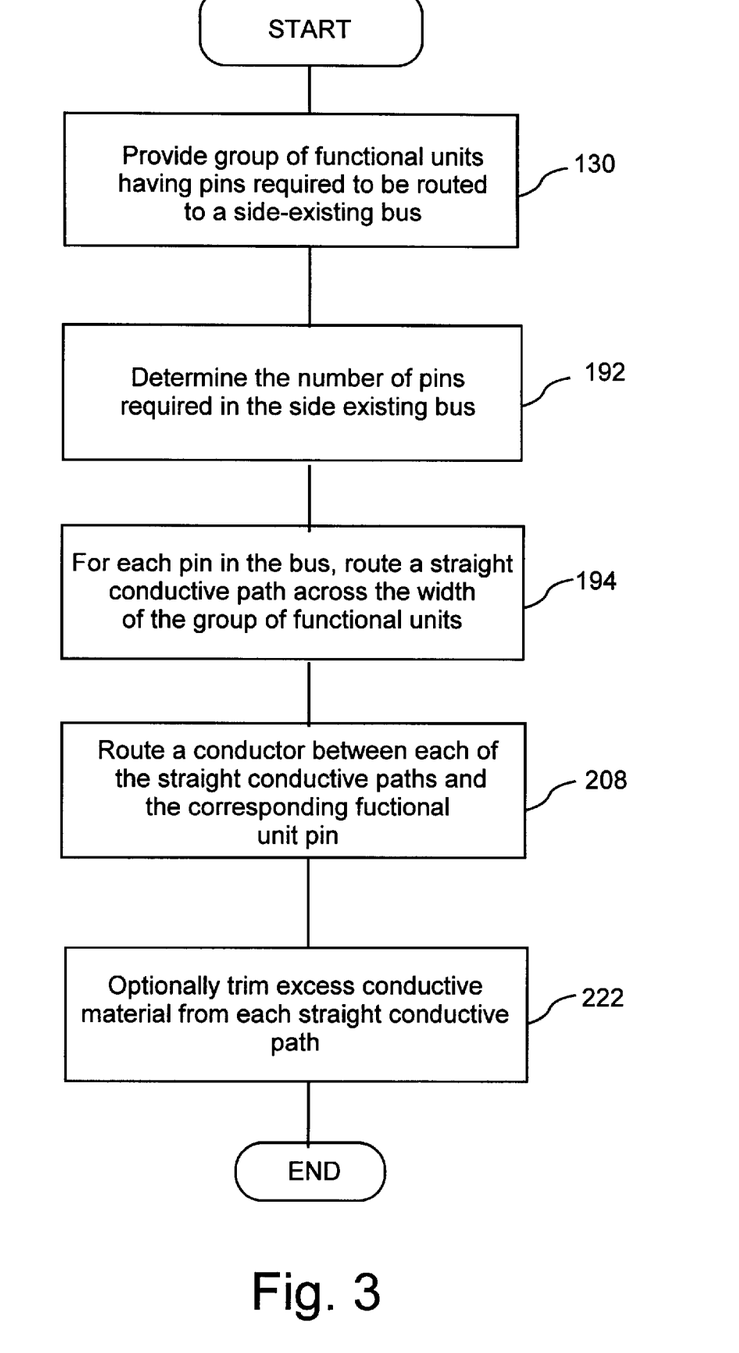
FIG. 3 is a flow chart showing steps in a method of the present invention.

FIG. 3 is a flow chart showing steps in a method of the present invention.

Figure 4:
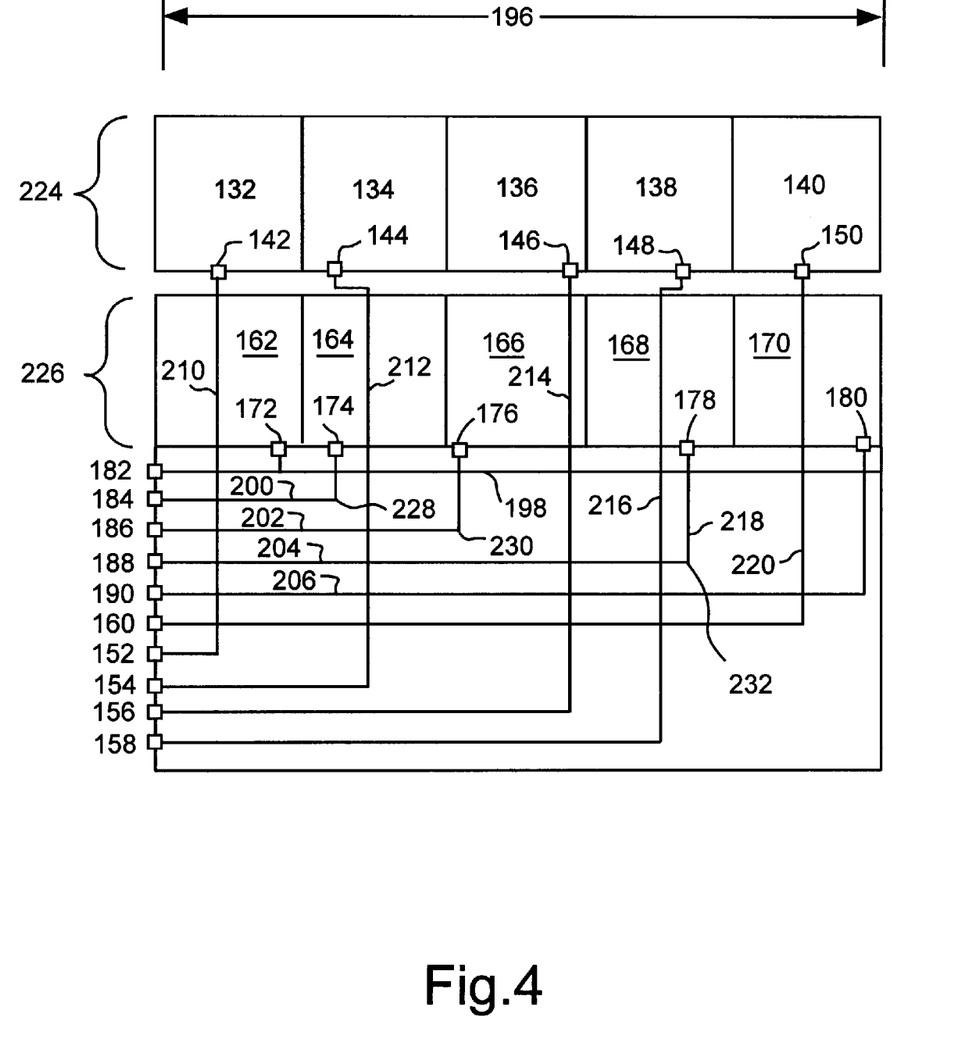
FIG. 4 shows the problem of FIG. 1 using a method of the present invention.

Referring to FIG. 3, the method begins at step 130 where a group of functional units having pins which are required to be routed to a side-exiting bus. An example of this is shown in FIG. 4 where functional units 132, 134, 136, 138, and 140 have pins 142, 144, 146, 148, and 150 which are required to be connected to pins 152, 154, 156, 158, and 160 respectively. A second set of functional units is shown as units 162, 164, 166, 168 and 170 having pins 172, 174, 176, 178, and 180 which are required to be connected to side-exiting pins 182, 184, 186, 188, and 190 respectively.

Referring again to FIG. 3, the method proceeds at step 192 where the number of pins in the side-exiting bus are determined. In the prior art, the number of pins in a side-exiting bus was constrained to be less than or equal to the number of functional blocks to which those pins connect. This is due to the prior art method requiring that the intermediate locations to which a conductive path is routed be placed in positions roughly centered on functional units, and the additional requirement that each intermediate location be adjacent to the previous intermediate location, in succession, from one side to the other.

The method of the present invention described herein removes the prior art constraint relating to the maximum number of pins allowed in the side-exiting bus, and thus allows the number of pins in the side-exiting bus to be greater than the number of functional units to which the pins in the bus connect.

At step 194, a conductive path is routed across the width of the block of function units for each of the pins in the side-exiting bus. An example of this step is seen in FIG. 4 where the group of functional units formed from 132, 134, 136, 138, and 140 has a width 196 across which conductive paths are routed such as conductive path 198. Other conductive paths such as paths 200, 202, 204, 206, etc., are routed in the same manner as conductive path 198 across the width 196, but are shown in a trimmed state for reasons that will become clear in succeeding paragraphs.

At step 208, conductive paths are routed from each of the functional unit pins to the conductive path associated with the particular side-exiting bus pin to which the given functional unit pins are required to be connected. Conductive paths 210, 212, 214, 216, 218 and 220 are examples of such conductive paths. It is preferred that conductive paths be routed over the smallest distance to the intended destination.

At optional step 222, unnecessary portions of conductive paths may be trimmed in order to reduce the possibility of inductive or capacitive coupling between conductors. Examples of this trimming step are seen when conductive paths 198 and 200 are compared. Path 198 is shown in its untrimmed condition, spanning the width 196 of either group 224 or 226. However, trimmed paths are those such as paths 200, 202, and 204 which are trimmed at points 228, 230 and 232 respectively.

Those of ordinary skill in the art having the benefit of this disclosure will readily realize that the present invention is not restricted to the bus example of FIG. 4. Rather, side exiting buses may be left oriented, right oriented, or a combination of right and left oriented.

Figure 5:
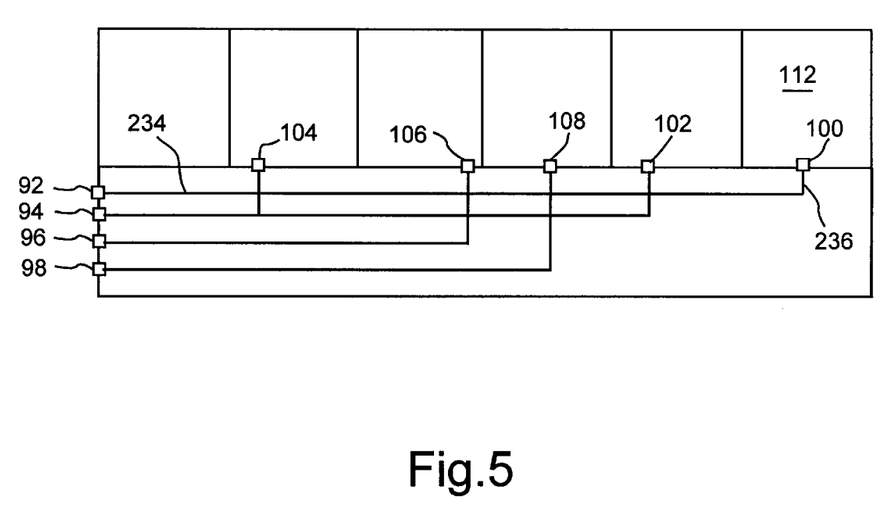
FIG. 5 shows the problem of FIG. 2 routed using a method of the present invention.

FIG. 5 shows the problem of FIG. 2 routed using a method of the present invention.

Those of ordinary skill in the art will readily appreciate that the FIG. 5 routing solution is significantly more efficient in the use of space than is the prior art routing solution of FIG. 2.

For example, in prior art FIG. 2, segment 118 will typically be routed using a different horizontal track than is segment 120. Correspondingly segment 114 and segment 116 utilize different vertical tracks. A track is a location which may be used to place a conductive path between two points. It is generally preferred to use as few horizontal and vertical tracks as possible in order to minimize the size of the entire circuit layout. Since using the prior art method causes segment 118 and segment 120 to utilize different horizontal tracks, and segment 114 and segment 116 to utilize different vertical tracks, the physical layout of the circuitry is less than optimal and occupies more space than necessary.

In FIG. 5, prior art segments 118 and 120 are replaced using the present invention by a single segment 234, and prior art segments 114 and 116 are replaced by a single segment 236. Those of ordinary skill in the art will readily realize other significant differences between prior art FIG. 2 and present invention FIG. 5.

Figure 6A:
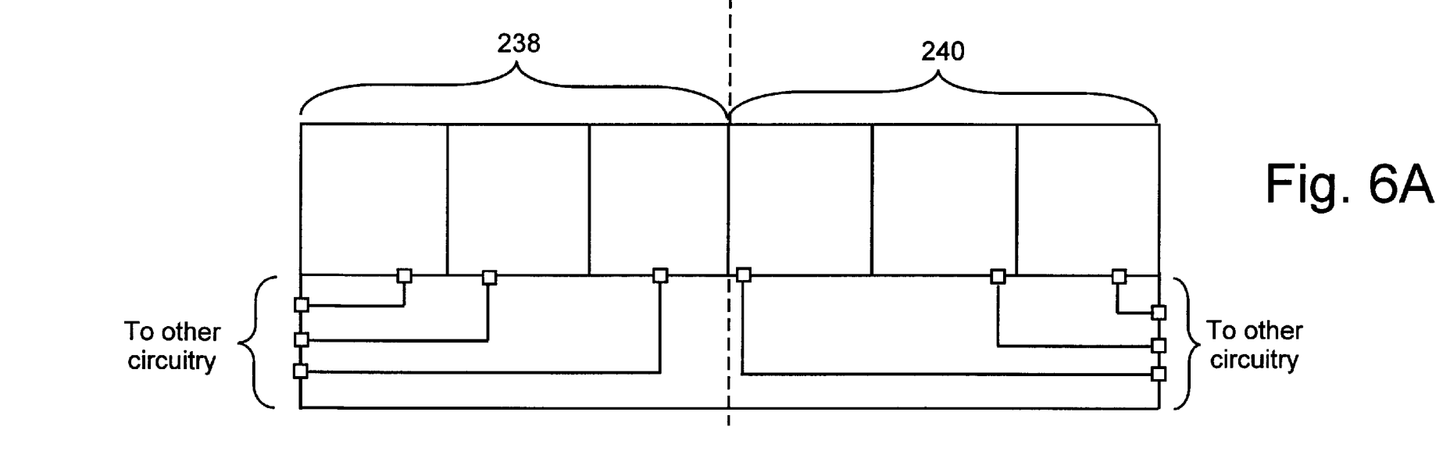
FIGS. 6A, 6B and 6C show routings which may result from performing the steps of the method of the present invention.
Figure 6B:
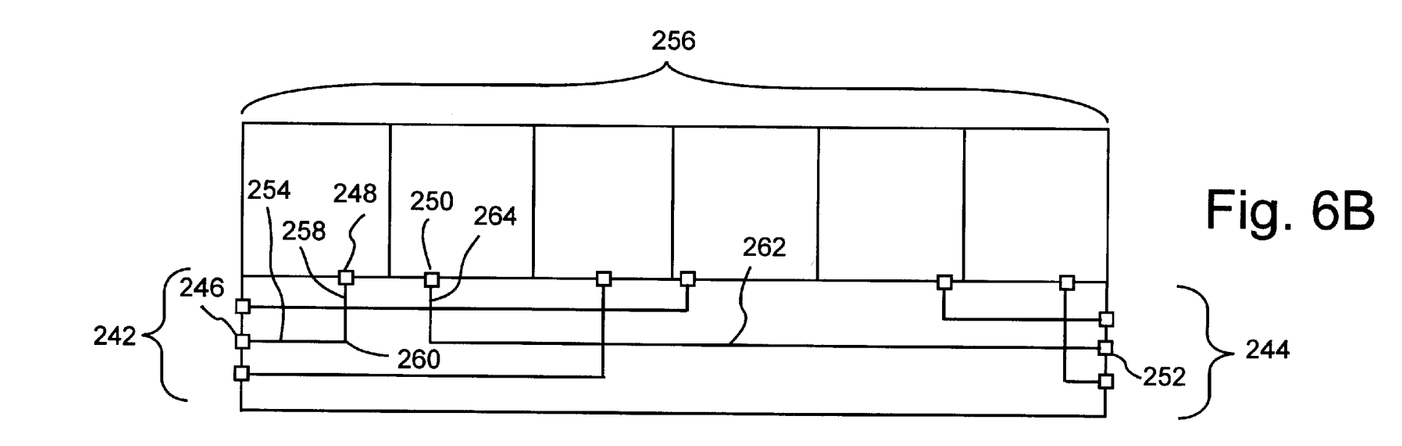
Figure 6C:
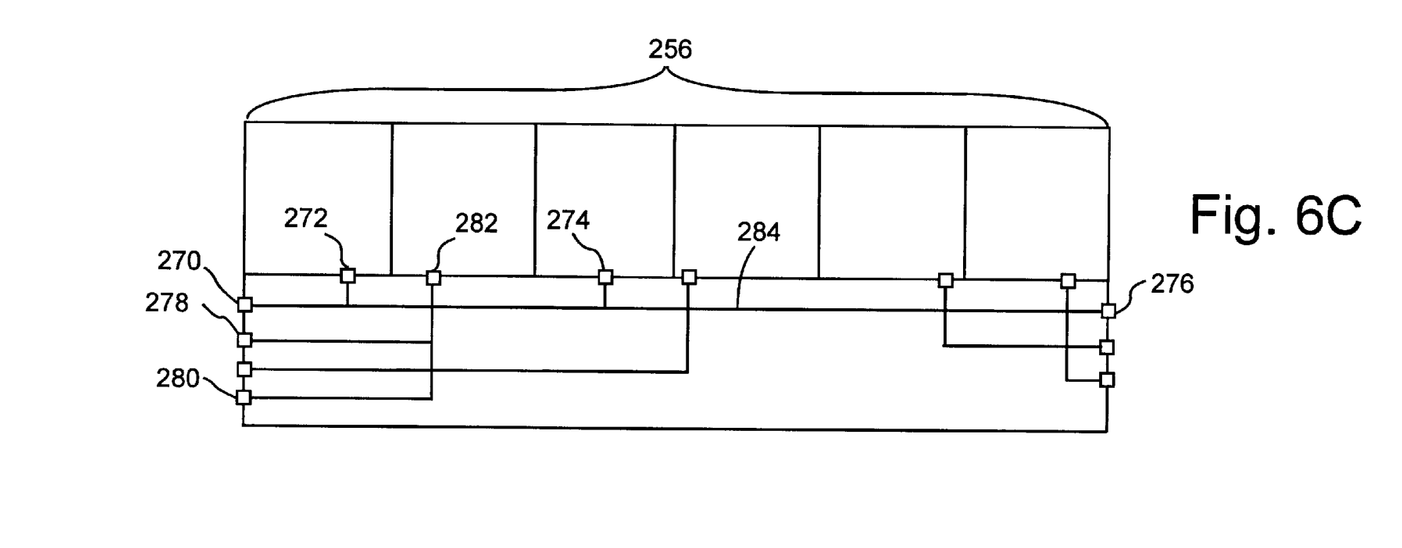

FIGS. 6A, 6B and 6C show routings which may result from performing the steps of the method of the present invention. Referring to FIG. 6A, functional unit groups 238 and 240 may be routed separately, resulting in the routing shown therein. It is contemplated that such separate routings will occur where two side exiting buses are required and the functional unit groups for each of the side-exiting buses are positioned most near the pins making up their respective side exiting bus. In this example, trimming step 222 of FIG. 3 is highly desirable, in order to achieve the most efficient routing.

Referring to FIG. 6B, a layout having side-exiting buses 242 and 244 is presented, wherein the functional units associated with a given side-exiting bus are not grouped together. In order to provide the most efficient routing, it is desirable to perform the routing of a single pin-to-pin conductive path and trim excess portions of routed paths away, prior to routing a second or succeeding conductive path. The reason for trimming excess portions from a path just routed is to free up portions of a track that might be able to be used later to route a different conductive path using a different portion of the same track.

A first conductive path between pins 246 and 248, and a second conductive path between pins 250 and 252 are examples of the results of the present invention routing method. If the conductive path between pins 246 and 248 is routed prior to routing the conductive path between pins 250 and 252, segment 254 would be routed first, and would span the width 256 of the entire functional group. Segment 258 would then be routed to connect to segment 254. Finally, segment 254 would be trimmed at point 260.

When the second conductive path is routed between pins 250 and 252, segment 262 is best routed prior to segment 264. Since there is already a segment present in the track being used for this horizontal segment, the routing of segment 262 terminates at least one vertical track away from point 260, so that the newly routed segment 262 will not interfere with the previously routed segment 254. Following segment 262 being routed, segment 264 is routed to connect with segment 262. Finally, segment 262 is either trimmed, or left alone. In this manner, more than one conductive path may utilize the same horizontal or vertical track, thus minimizing the amount of space required for the routing.

FIG. 6C shows a similar routing as FIGS. 6A and 6B except for three additional types of routing scenarios which are easily routed using the method of the present invention. First, a side exiting pin 270 is routed to more than one functional unit pin such as pins 272 and 274 and also connects with a second side exiting pin 276 on the other side of the functional group. Second, two side exiting pins 278 and 280 are routed to the same functional unit pin 282.

In the first scenario, conductive path 284 from either pin 270 or pin 276 is routed across the width of the functional group, and then all associated functional unit pins are connected thereto. Since conductive path 284 spans the width 256 of the functional group and terminates in a pin on each end, there is no need to trim excess conductive material.

In the second scenario, once a conductive path has been routed between pins 278 and 282 or between pins 280 and 282, it is trivial to route the additional conductive path to connect with the first.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for routing a conductive path in an integrated circuit comprising:

providing a side exiting bus comprising at least one pin;

providing a plurality of functional units, at least one functional unit having a pin required to be electrically connected to a pin in said side-exiting bus;

routing a first conductive path from one of said at least one pins in said side exiting bus to a point external to said functional units, the resulting conductive path spanning the width of said plurality of functional units;

routing a second conductive path in a straight line from said at least one pin in said at least one functional unit to a point on said first conductive path.

2. The method of claim 1 further including trimming excess conductive material from said first conductive path.

3. The method of claim 1 further including routing a third conductive path in a straight line from one of said at least one pins in said at least one functional unit to a point on said first conductive path.

* * * * *